(12) United States Patent
Cheng et al.

(10) Patent No.: US 11,588,104 B2
(45) Date of Patent: Feb. 21, 2023

(54) RESISTIVE MEMORY WITH VERTICAL TRANSPORT TRANSISTOR

(71) Applicant: International Business Machines Corporation, Armonk, NY (US)

(72) Inventors: Kangguo Cheng, Schenectady, NY (US); Carl Radens, LaGrangeville, NY (US); Ruilong Xie, Niskayuna, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 17/346,686

(22) Filed: Jun. 14, 2021

(65) Prior Publication Data
US 2022/0399491 A1    Dec. 15, 2022

(51) Int. Cl.
G11C 13/00    (2006.01)
H01L 45/00    (2006.01)
H01L 27/24    (2006.01)

(52) U.S. Cl.
CPC ...... *H01L 45/1233* (2013.01); *G11C 13/0026* (2013.01); *G11C 13/0028* (2013.01); *H01L 27/2454* (2013.01); *H01L 45/1253* (2013.01); *H01L 45/146* (2013.01); *H01L 45/1616* (2013.01); *H01L 45/1675* (2013.01); *H01L 45/1691* (2013.01)

(58) Field of Classification Search
CPC ............. H01L 45/1233; H01L 45/1253; H01L 45/146; H01L 45/1616; H01L 45/1675; H01L 45/1691; G11C 13/0026; G11C 13/0028

USPC ................................................. 365/148, 158
See application file for complete search history.

(56) References Cited

U.S. PATENT DOCUMENTS

| | | | |
|---|---|---|---|
| 8,395,139 B1 | 3/2013 | Ho | |
| 8,471,232 B2 | 6/2013 | Kim | |
| 8,816,316 B2 | 8/2014 | Liu | |
| 9,620,566 B2 | 4/2017 | Park | |
| 9,691,819 B2 | 6/2017 | Oh | |
| 9,761,726 B1* | 9/2017 | Balakrishnan | H01L 29/78642 |
| 10,229,920 B1* | 3/2019 | Cheng | H01L 27/0922 |
| 10,269,869 B1 | 4/2019 | Ando | |
| 10,283,565 B1 | 5/2019 | Xu | |
| 10,332,881 B1* | 6/2019 | Badaroglu | H01L 21/823412 |
| 10,483,200 B1* | 11/2019 | Yang | H01L 23/528 |
| 2016/0118404 A1* | 4/2016 | Peng | H01L 27/11587 257/295 |
| 2017/0141214 A1* | 5/2017 | Zang | H01L 21/823821 |
| 2018/0061759 A1* | 3/2018 | Li | H01L 27/0886 |
| 2018/0097001 A1* | 4/2018 | Bi | H01L 27/0629 |
| 2018/0123038 A1* | 5/2018 | Lee | H01L 27/2463 |
| 2019/0006416 A1* | 1/2019 | Lee | G11C 11/18 |
| 2019/0157554 A1* | 5/2019 | Mo | H01L 45/1675 |

(Continued)

*Primary Examiner* — Michael T Tran
(74) *Attorney, Agent, or Firm* — Gavin Giraud

(57) ABSTRACT

Embodiments of the present invention include a memory cell that has a vertically-oriented fin. The memory cell may also include a resistive memory device located on a first lateral side of the fin. The resistive memory device may include a bottom electrode, a top electrode, and a resistive element between the bottom electrode and the top electrode. The memory cell may also include a vertical field-effect transistor having a metal gate and a gate dielectric contacting a second lateral side of the fin opposite the first lateral side.

20 Claims, 7 Drawing Sheets

(56) References Cited

U.S. PATENT DOCUMENTS

| | | | |
|---|---|---|---|
| 2019/0206888 A1* | 7/2019 | Peng | H01L 29/7883 |
| 2020/0006656 A1* | 1/2020 | Leobandung | H01L 27/2436 |
| 2020/0136035 A1* | 4/2020 | Cheng | H01L 45/1206 |
| 2020/0258881 A1* | 8/2020 | Lilak | H01L 29/0821 |
| 2020/0258941 A1* | 8/2020 | Lee | H01L 45/08 |
| 2020/0312658 A1* | 10/2020 | Miura | H01L 29/1054 |
| 2020/0343144 A1* | 10/2020 | Li | H01L 21/823481 |
| 2020/0402989 A1* | 12/2020 | Kawashima | H01L 29/40117 |
| 2020/0403073 A1* | 12/2020 | Mihara | H01L 29/7851 |
| 2021/0193737 A1* | 6/2021 | Reznicek | H01L 45/122 |
| 2022/0069010 A1* | 3/2022 | Lee | H01L 43/02 |
| 2022/0108997 A1* | 4/2022 | Hekmatshoartabari | H01L 29/66825 |
| 2022/0199828 A1* | 6/2022 | Mehrotra | H01L 27/0886 |

* cited by examiner

RESISTIVE MEMORY WITH VERTICAL TRANSPORT TRANSISTOR

BACKGROUND

The present invention relates generally to the field of non-volatile memory, and more particularly to providing a one-transistor-one-resistor memory cell with a single fin.

Resistive random-access memory (ReRAM or RRAM) is an emerging non-volatile (NV) random-access memory (RAM). It has potentials for both classic memory applications and neuromorphic computing.

In a RRAM, a memristor element is positioned between two electrodes. Defects such as oxygen vacancies are intentionally introduced in the memristor film to enable the formation of filaments. A write circuit can provide voltages to the memristor element to set or reset the filaments, and therefore program logic states within the RRAM. That is, the write circuit programs a low-resistance state (e.g., logic "1") by a so-called SET operation, or a high-resistance state (e.g., logic "0") by a so-called RESET operation. The SET and RESET operations may include changing the polarity of electrical field across the memristor element.

In most RRAM devices, a selector (typically a transistor) is desired in series with the memristor element to form a one-transistor-one-resistor ("1T1R", T standing for transistor, and R standing for resistor) cell. As the scaling of 1T1R cell is limited to transistor scaling, there is a need of innovating in highly scalable RRAM cell.

SUMMARY

Aspects of an embodiment of the present invention disclose a memory cell that include a vertically-oriented fin. The memory cell may also include a resistive memory device located on a first lateral side of the fin. The resistive memory device may include a bottom electrode, a top electrode, and a resistive element between the bottom electrode and the top electrode. The memory cell may also include a vertical field-effect transistor having a metal gate and a gate dielectric contacting a second lateral side of the fin opposite the first lateral side.

Aspects of an embodiment of the present invention disclose a method of fabricating a memory cell. The method includes forming a channel layer on a doped bottom source/drain (S/D) layer, etching a portion of the undoped channel layer to form a fin, forming a resistive memory device on a first lateral side of the fin, forming a gate dielectric contacting a second lateral side of the fin, and forming a metal gate contacting the gate dielectric.

Aspects of an embodiment of the present invention disclose a memory cell that includes a fin oriented vertically between a top source/drain (S/D) layer and a bottom S/D layer. The memory cell may also include a resistive memory device located on a first lateral side of the fin that has a bottom electrode electrically contacting the bottom S/D layer. The memory cell may also include a field-effect transistor with a gate conductor and a gate dielectric contacting a second lateral side of the fin.

DETAILED DESCRIPTION

Figure 1A:
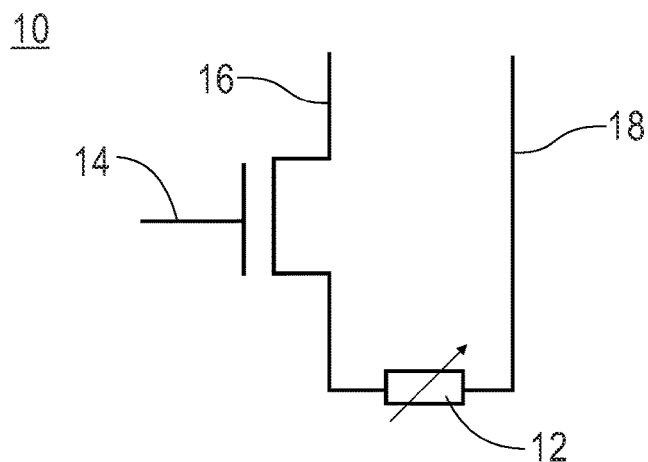
FIG. 1A depicts a one-transistor-one-resistor memory cell, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface. Typically, the major surface is along a plane of a monocrystalline silicon layer on which transistor devices are fabricated.

The present invention pertains to a one-transistor-one-resistor (1T1R) resistive memory cell for semiconductor devices. The 1T1R resistive memory cell has a vertical fin separating a transistor and a resistive memory device. A possible method for fabricating such a 1T1R resistive memory cell incorporating a self-aligned memory process is also disclosed.

As described in detail below, an aspect of the current invention is a method of operating and fabricating a 1T1R memory cell that includes a vertically-oriented fin. The fin separates a field-effect transistor (FET) from a resistive memory device. The reduced lateral separation of the FET and the resistive memory device enables fabrication of the 1T1R memory cell in a reduced area, which leads to a higher memory cell packing density and improved functioning of memory chips. Details of operation are explained with regard to the Figures in the description below.

FIG. 1A depicts a schematic diagram of a 1T1R memory cell 10, in accordance with one embodiment of the present invention. This 1T1R memory cell 10 stores data in the form of a resistance of a resistive element 12. Similarly to conventional DRAM cells, the 1T1R memory cell 10 uses a word line 14 to select a row of cells, and a bit line 16 is shared by the cells in a column for reading/writing. During write operation, an electrical signal (i.e., voltage or current) is applied to the word line 14, and a positive or negative signal is applied across the resistive element 12 for writing logic 1 or logic 0, respectively. This voltage drop across the resistive element 12 is achieved by charging the bit line 16 (for logic 1) or discharging the bit line 16 to 0 V (for logic 0) and applying another electrical signal at a source line 18. The write access time is dependent on the voltage drop across the resistive element 12 and the physical parameters of the resistive element 12. While writing logic 1, the current flowing through the resistive element 12 increases the size of conductive region. While writing logic 0, the current flowing through the memristor decreases the size of conductive region. To read data out of the 1T1R memory cell 10 a write circuit discharges the bit line 16 to 0 V, applies a signal to the word line 14 and applies a signal to the source line 18. For a fixed predefined time period, depending on the data stored in the 1T1R memory cell 10 (i.e. the resistance of the resistive element 12), the bit line 16 charges to a value that is above (for logic 1) or below (for logic 0) a threshold voltage.

Figure 1B:
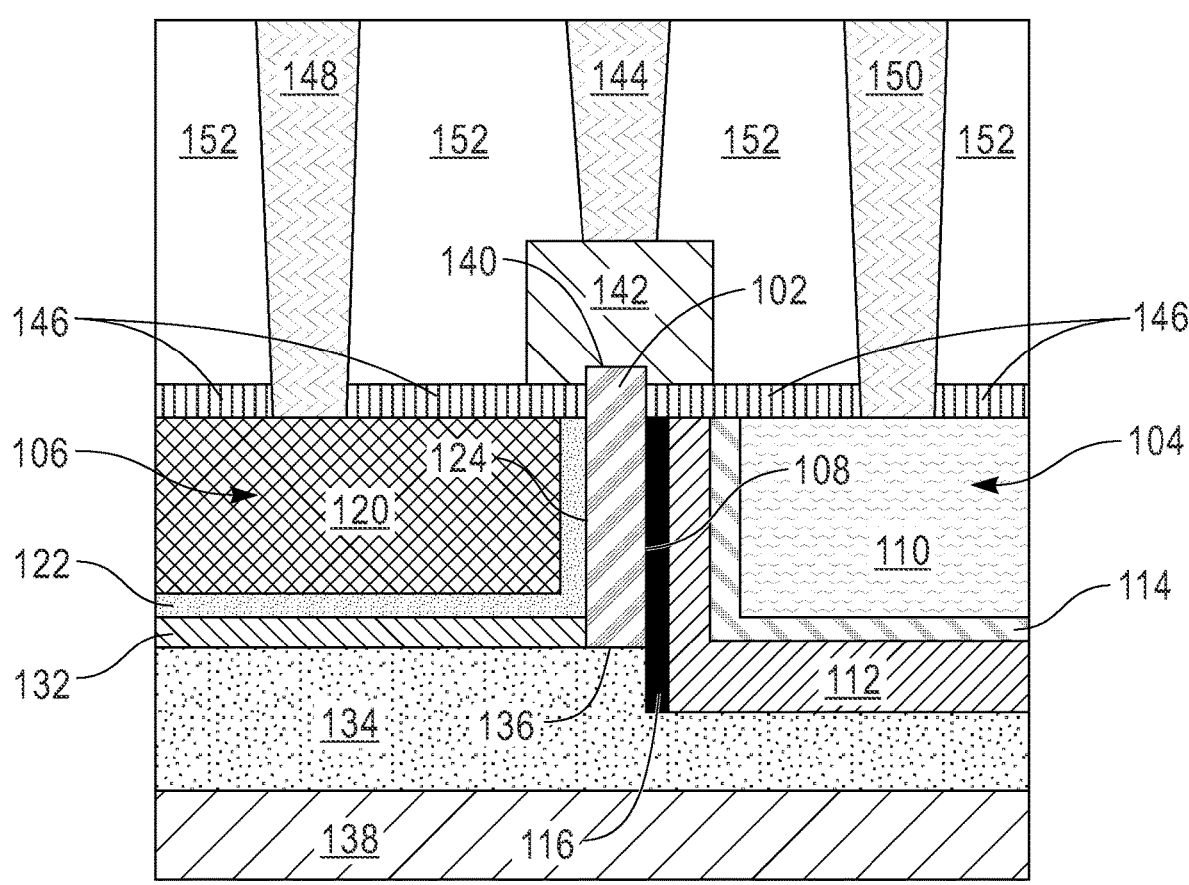
FIG. 1B depicts a one-transistor-one-resistor memory cell having a vertical fin, in accordance with one embodiment of the present invention.

FIG. 1B depicts a one-transistor-one-resistor (1T1R) memory cell 100 having a vertically-oriented fin 102, in accordance with one embodiment of the present invention. The 1T1R memory cell 100 includes a resistive memory device 104 and a field-effect transistor (FET) 106. The resistive memory device 104 is located on a first lateral side 108 of the fin 102, and includes a top electrode 110, a bottom electrode 112, and a resistive element 114 between the bottom electrode 112 and the top electrode 110. The resistive memory device 104 operates to perform logic operations or store weight values. Specifically, a write circuit may apply electrical pulses (i.e., current or voltage pulses) to the resistive memory device 104 that program the resistive element 114 to a resistance value. For example, the electrical pulses supplied by the write circuit may be tuned to a zero voltage, a positive orientation of a complimentary switching voltage ("Vset"), or a negative orientation of the complimentary switching voltage ("Vset"). The resistance value may be read at a later point using a read voltage across the resistive memory device 104. In the illustrated embodiment, the bottom electrode 112 does not contact the first side 108 of the fin 102, due to a vertical spacer 116 located between the bottom electrode 112 and the fin 102. The vertical spacer 116 decouples the bottom electrode 112 from the fin 102 so that the resistive memory device 104 can be used as a resistive element. In certain embodiments, the bottom electrode 112 may contact the fin 102 on the first side 108.

The FET 106 includes a gate conductor 120 and a gate dielectric 122. The gate dielectric 122 contacts a second lateral side 124 of the fin 102, and contacts the gate conductor 120 on a lateral side 128 of the gate conductor 120 and a bottom side 130 of the gate conductor 120. A bottom spacer 132 insulates the FET 106 from a bottom source/drain (S/D) layer 134. The bottom S/D layer 134 contacts a bottom 136 of the fin 102 and is doped to enable a current to flow to the resistive memory device 104 depending on a voltage (applied or interrupted) of the FET 106. The bottom S/D layer 134 is supported by a substrate layer 138. The substrate layer 138 is typically silicon, but any substrate material may be used to construct the substrate layer 138 without diverging from the embodiments disclosed herein.

A top 140 of the fin 102 is also connected to a source/drain; specifically, a top S/D layer 142. The top S/D layer 142 electrically connects to a bit line 144. A top spacer 146 separates the top S/D layer 142 from the resistive memory device 104 and the FET 106. The bit line 144, word line 148, and source line 150 connect the 1T1R memory cell 100 to other memory cells, circuits, etc. An interlayer dielectric 152 insulates the 1T1R memory cell 100 from other layers of cells.

Figure 2:
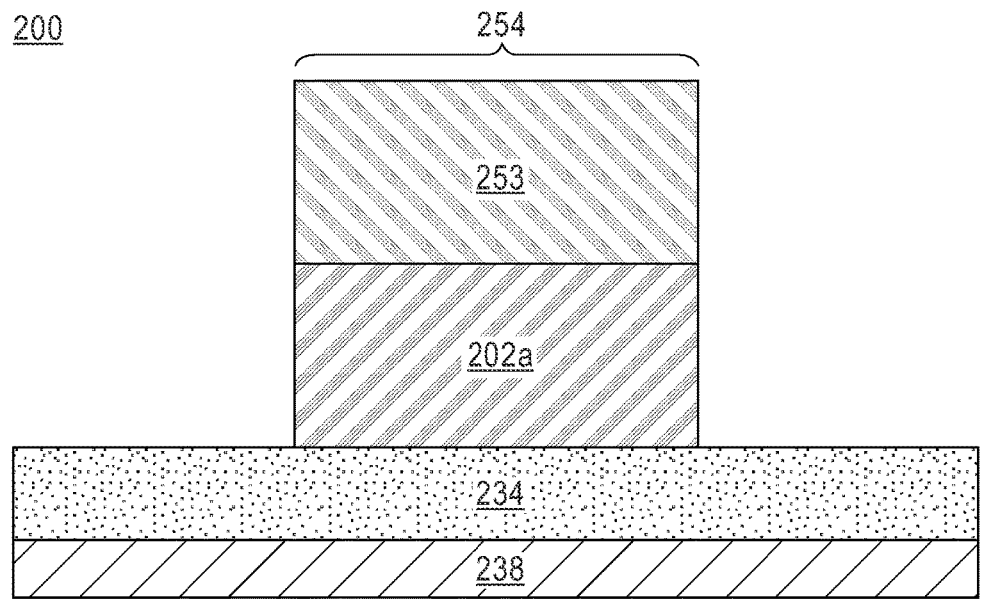
FIGS. 2-12 depict stages in a method of forming a one-transistor-one-resistor memory cell having a vertical fin, in accordance with one embodiment of the present invention.

A process for fabricating an embodiment of a 1T1R memory cell 200 is illustrated in FIGS. 2-13. FIG. 2 depicts the 1T1R memory cell 200 in a stage of fabrication with a substrate 238 and a doped bottom S/D layer 234. The bottom S/D layer 234 may be formed epitaxially on the substrate 238 and doped, for example, the bottom S/D layer 234 may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultra-high vacuum chemical vapor deposition (UHVCVD), low-pressure chemical vapor deposition (LPCVD), limited reaction processing CVD (LRPCVD), or other suitable process.

Epitaxial silicon, silicon germanium (SiGe), germanium (Ge), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $3\times10^{21}$ cm$^{-3}$, or preferably between $2\times10^{20}$ cm$^{-3}$ to $3\times10^{21}$ cm$^{-3}$. Other types of doping may be used in other embodiments of the 1T1R memory cell 200. A channel layer 202a, that will eventually become a fin 202, is grown (e.g., epitaxially) on top of the bottom S/D layer 234. The channel layer 202a can be undoped or lightly doped (e.g., with a doping concentration below $1\times10^{18}$ cm$^{-3}$). A hard mark 253 is also formed on the channel layer 202a, for example, by deposition. The channel layer 202a and the hard mask 253 are shaped to form a pillar 254 above the substrate 238. The pillar 254 may be formed with known techniques such as photolithography patterning, and etching.

Figure 3:
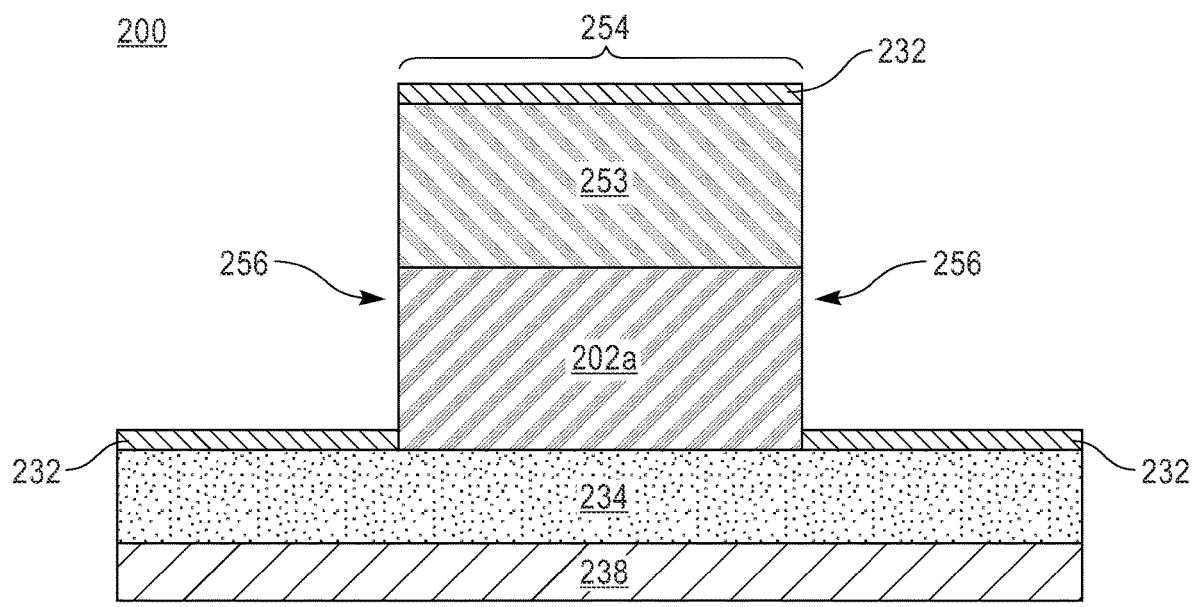

FIG. 3 depicts the 1T1R memory cell 200 in a stage of fabrication with a bottom spacer 232 formed on top of the hard mask 253 and the bottom S/D layer 234. The bottom spacer 232 may be formed of silicon nitride (SiN), for example, and is applied by directional deposition followed by etch back so that the pillar 254 does not have any SiN on either side 256.

Figure 4:
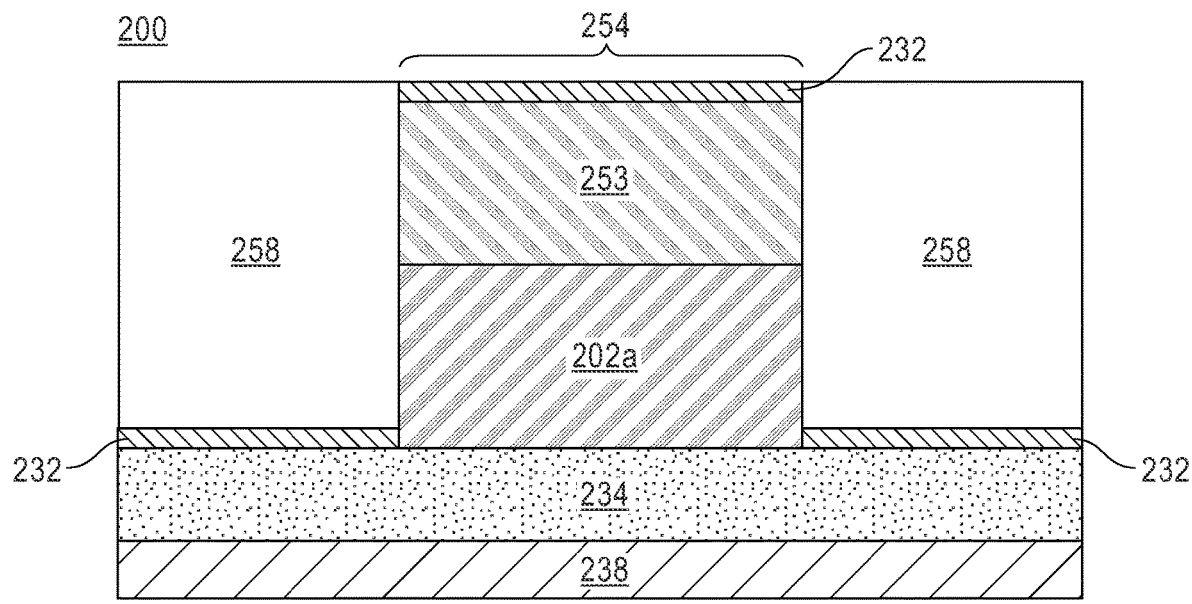

FIG. 4 depicts the 1T1R memory cell 200 in a stage of fabrication with a sacrificial material 258 deposited beside the pillar 254. The sacrificial material 258 may include oxide or another insulating material, and may be planarized (e.g., by chemical mechanical polish) after the deposition of the sacrificial material 258.

Figure 5:
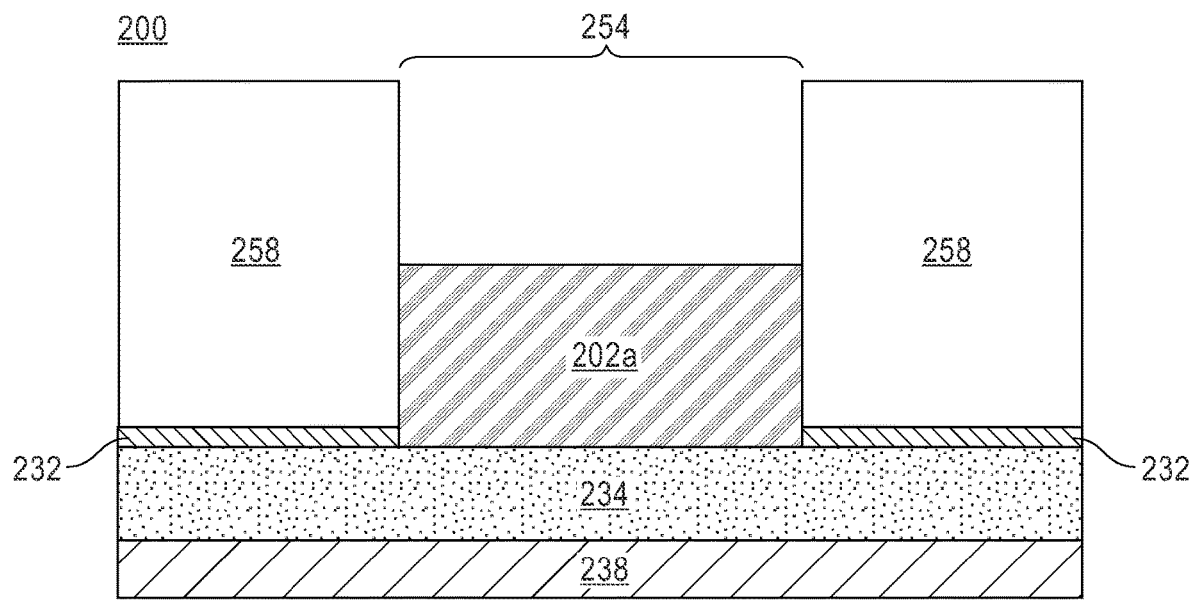

FIG. 5 depicts the 1T1R memory cell 200 in a stage of fabrication with the bottom spacer 232 and the underlying the hard mask 253 etched from the pillar 254. The bottom spacer 232 on top of the hardmask 253 and the hardmask 253 can be etched sequentially with any suitable etch processes. For example, in the case that the bottom spacer and the hardmask both comprise silicon nitride, an aqueous etch containing hot phosphoric acid can be used to etch silicon nitride. Once the portions of the bottom spacer 232 and 253 the hardmask 253 that formed on top of the hard mask 253 is also etched off, leaving only the channel layer 202a of the pillar 254.

Figure 6:
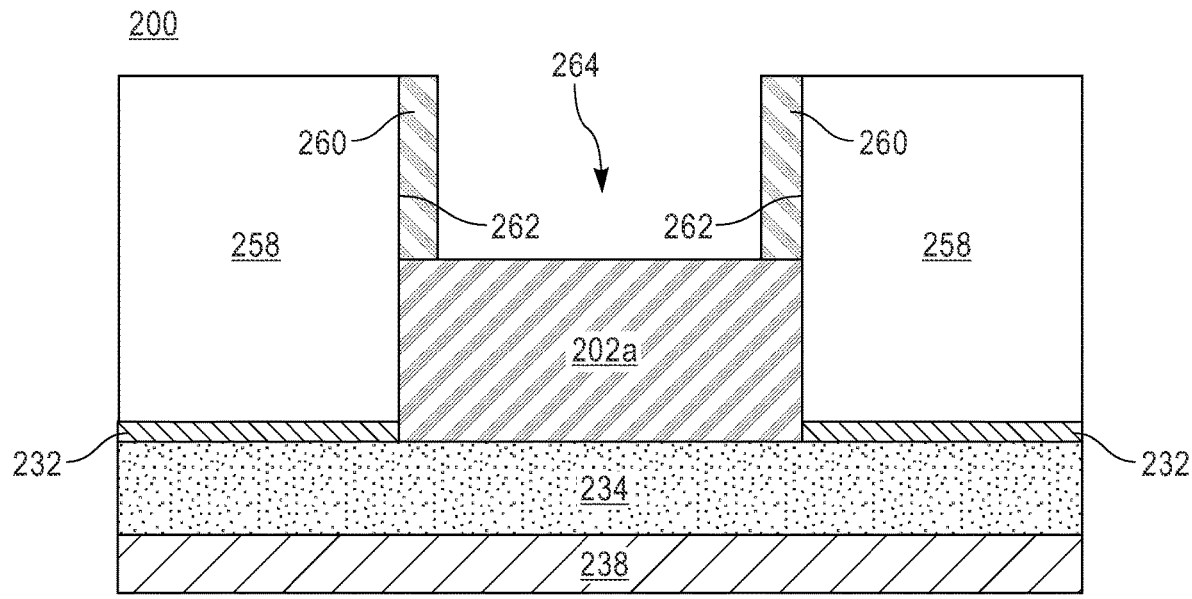

FIG. 6 depicts the 1T1R memory cell 200 in a stage of fabrication with sidewall spacers 260 formed on sidewalls 262 of the sacrificial material 258. The sidewall spacers 260 may be formed by deposition of a material (e.g., silicon nitride) followed by reactive-ion etching or other vertical etching methods.

Figure 7:
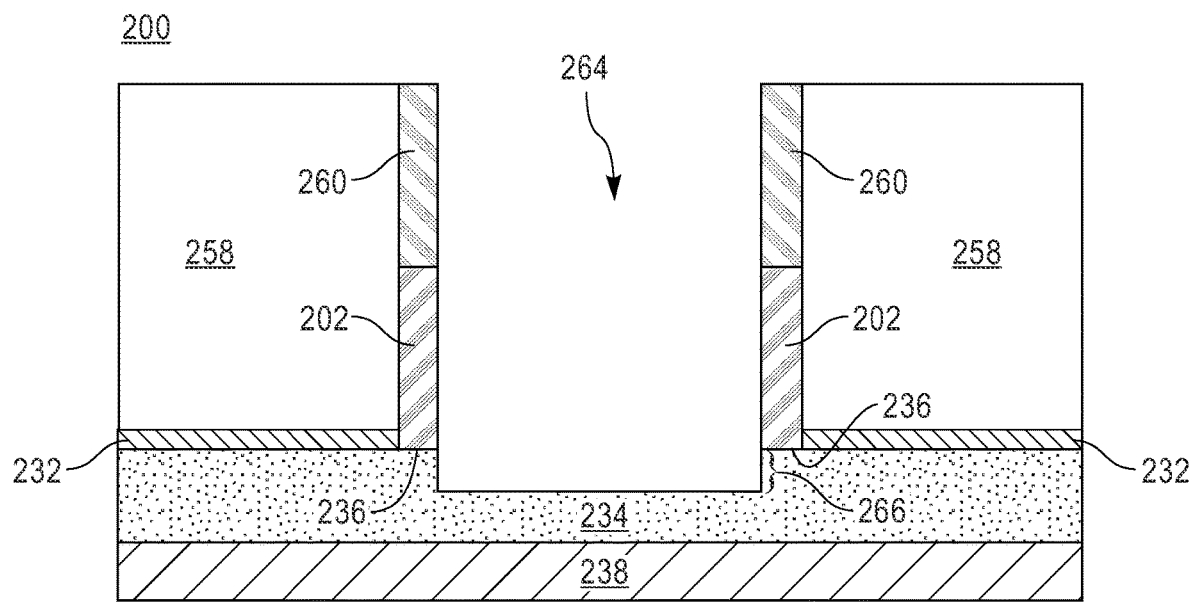

FIG. 7 depicts the 1T1R memory cell 200 in a stage of fabrication with an etch profile 264 etched through the channel layer 202a. The etch profile 264 leaves fins 202 on either side as remainders of the channel layer 202a. The etch profile 264 extends vertically down beyond a bottom 236 of the fins 202 into the bottom S/D layer 234. An extent 266 that the etch profile 264 extends vertically down is tuned to enable proper current flow into the eventual RRAM device that is formed within the etch profile 264.

Figure 8:
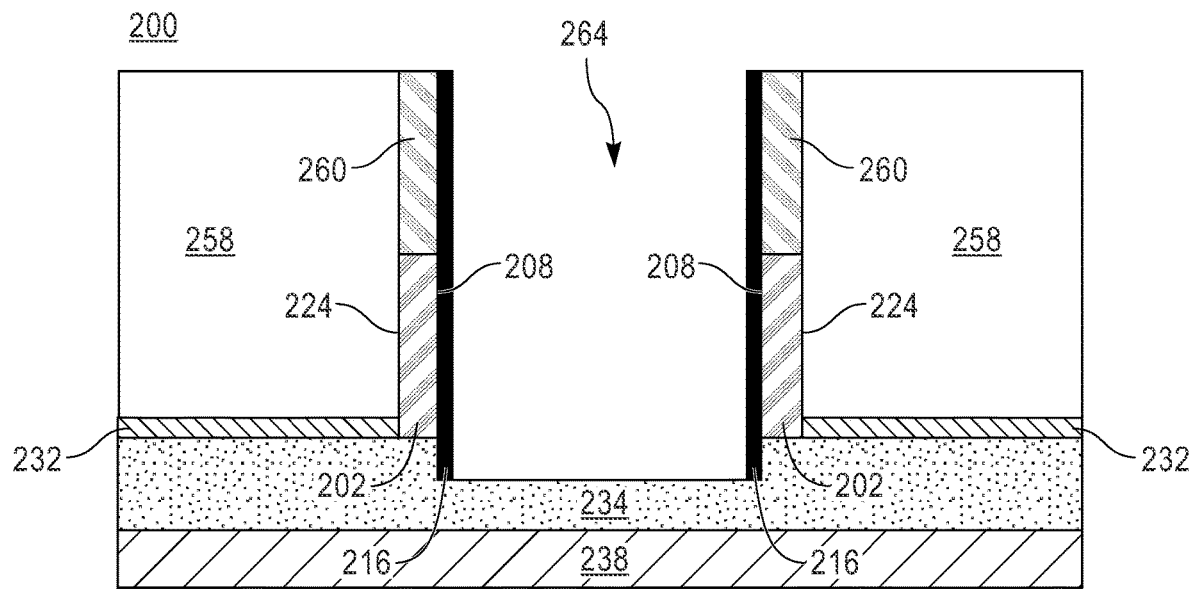

FIG. 8 depicts the 1T1R memory cell 200 in a stage of fabrication with a vertical spacer 216 formed within the etch profile 264. Thus, the fin 202 has the vertical spacer 216 on a first lateral side 208 and the bottom spacer 232 on a second lateral side 224. The vertical spacer 216 may be formed of any suitable dielectric, including but not limited to silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. The dielectric material can be a low-k material having a dielectric constant less than about 7, less than about 5. Spacers can be formed by any suitable techniques such as deposition followed by directional etch. Deposition may include but is not limited to, atomic layer deposition (ALD), chemical vapor deposition (CVD). Directional etch may include but is not limited to, reactive ion etch (RIE).

Figure 9:
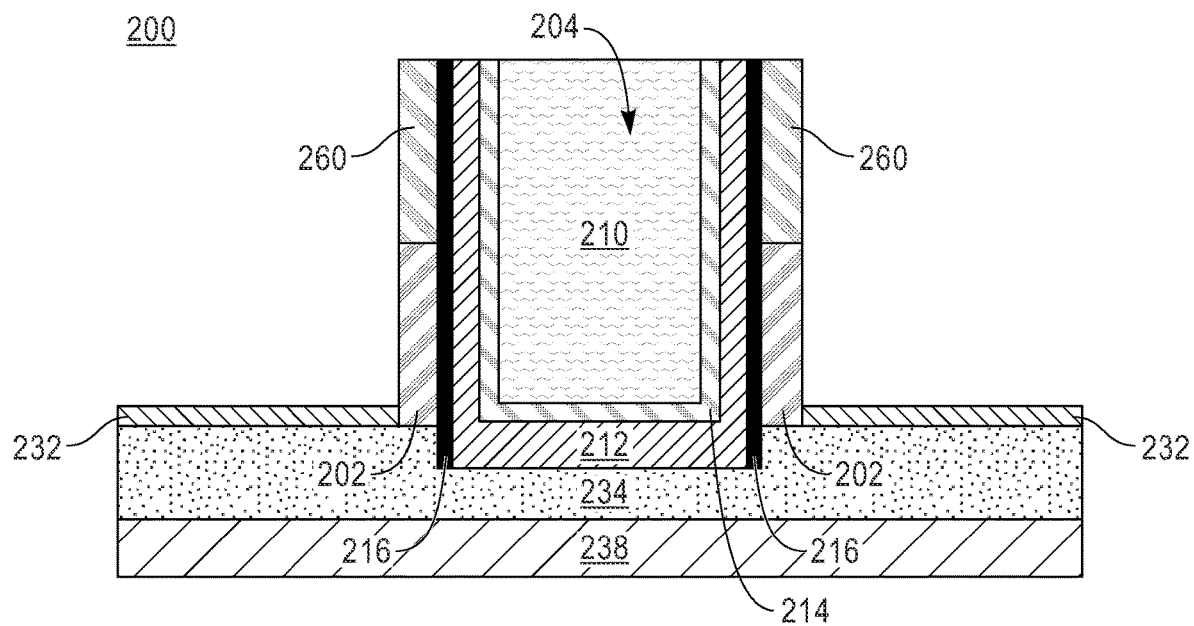

FIG. 9 depicts the 1T1R memory cell 200 in a stage of fabrication with a resistive memory device 204 formed within the etch profile 264. The RRAM device 204 includes a bottom electrode 212, a top electrode 210, and a resistive element 214 between the bottom electrode 212 and the top electrode 210. The resistive element 214 may include hafnium oxide with introduced defects or oxygen vacancies that form filaments based on the application of set and reset voltages. The resistive element 214 can be formed, for example, by conformal deposition processes include, but are not limited to, chemical vapor deposition (CVD), atomic layer deposition (ALD). The top electrode 210 and the bottom electrode 212 are typically formed from deposited metal or other conductive material. The resistive memory device 204 may be planarized after being deposited within the etch profile 264. The resistive element 214 can also be a transition metal oxide such as nickel oxide, tantalum oxide, titanium oxide, hafnium oxide, tungsten oxide, zirconium oxide, aluminum oxide, strontium titanate, and combinations thereof. The top electrode 210 and the bottom electrode 212 can include a conductive material, such as copper, aluminum, silver, gold, tungsten, platinum, tantalum, ruthenium, etc. In some embodiments, the top electrode and the bottom electrode can include nitrides such as titanium nitride (TiN) or tantalum nitride. In one embodiment, the top electrode 44 and the bottom electrode comprise titanium nitride but different composition ratio of titanium and nitrogen. For example, the top electrode may contain more titanium than the bottom electrode. The top electrode 210, the resistive element 214 and the bottom electrode 212 form a resistive memory. Once the resistive memory device 204 is deposited, sacrificial material 258 is removed as illustrated.

Figure 10:
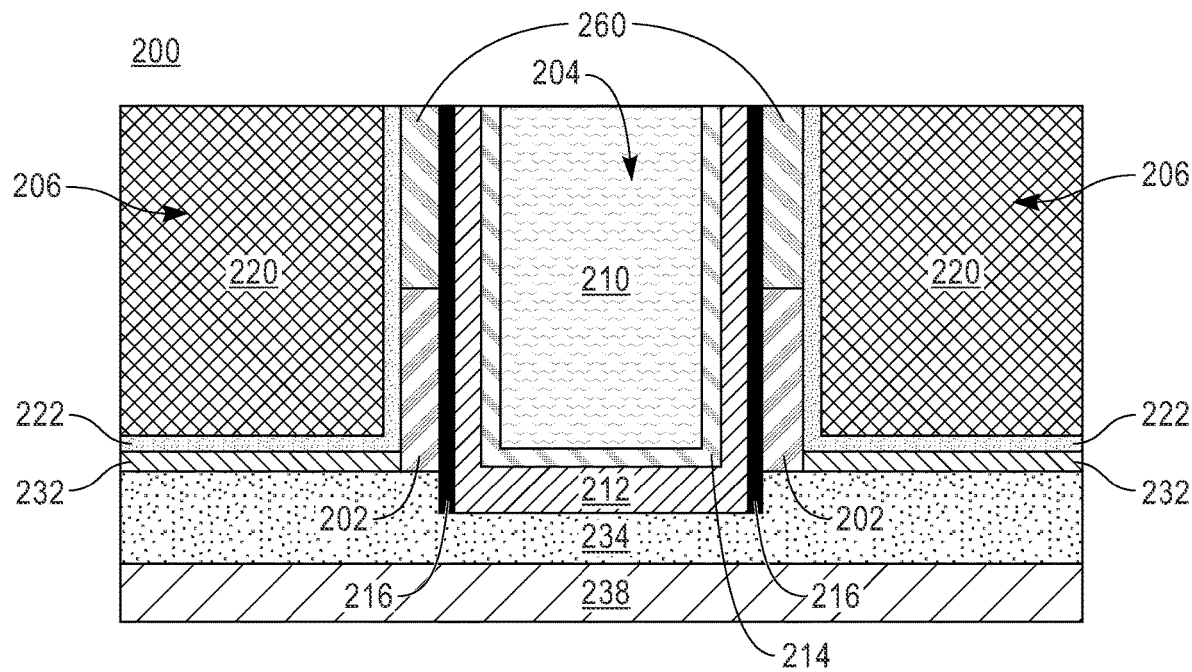

FIG. 10 depicts the 1T1R memory cell 200 in a stage of fabrication with the FET 206 deposited. The FET 206 includes a gate conductor 220 and a gate dielectric 222 that are deposited using known techniques, including but not limited to ALD and CVD. The gate conductor 220 may include workfunction metal, or may be made entirely of workfunction metal. The gate dielectric 222 may include a high-k gate dielectric material. Gate dielectric can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. In certain embodiments, a material of the resistive element 214 and a material of the gate dielectric 222 may include the same material, such that the material of the resistive element 214 differs from the material of the gate dielectric 222 only in an atomic concentration. The gate dielectric material can be formed by any suitable process or any suitable combination of multiple processes, including but not limited to, thermal oxidation, chemical oxidation, thermal nitridation, plasma oxidation, plasma nitridation, ALD, CVD, etc. In some embodiments, the gate dielectric has a thickness ranging from 1 nm to 5 nm, although less thickness and greater thickness are also conceived.

Gate conductor can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In one embodiment, the gate dielectric 222 and the resistive element 214 have substantially the same composition (e.g., hafnium oxide) but different thickness. For example, the gate dielectric 222 can have a thickness of about 2 nanometers (nm) and the resistive element 214 can have a thickness of about 4 nm. In another embodiment, the gate dielectric 222 and the resistive element 214 have different materials. For example, the gate dielectric 222 can be hafnium oxide and the resistive element 214 can be tantalum oxide.

Figure 11:
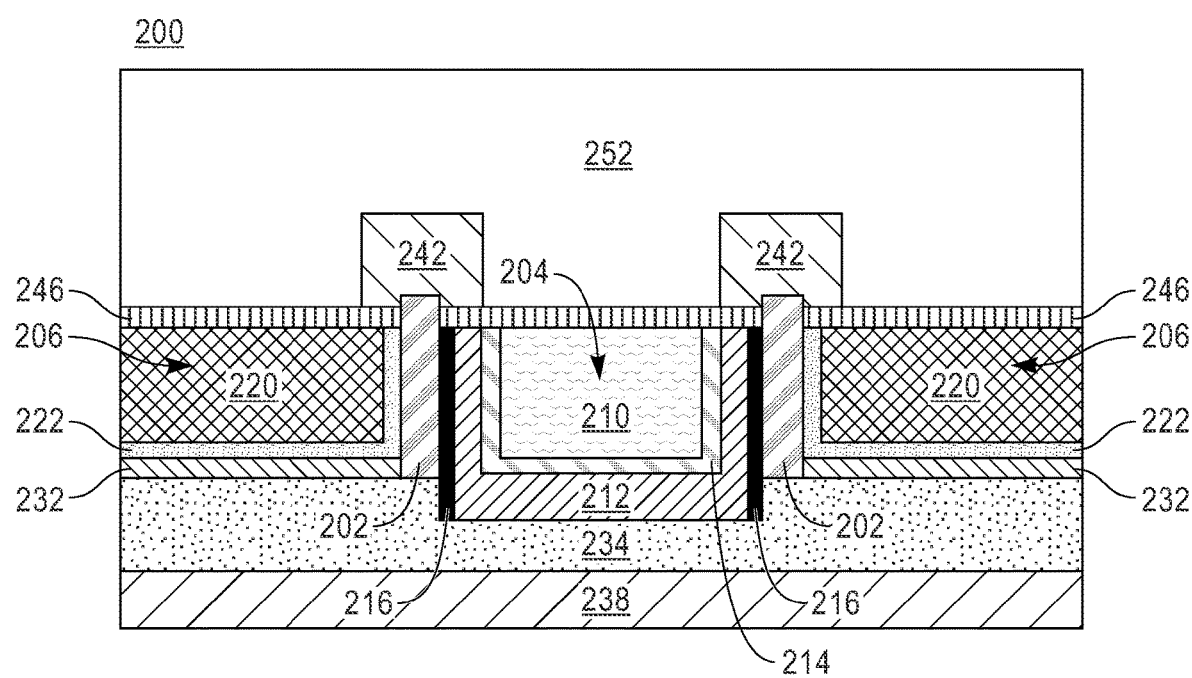

FIG. 11 depicts the 1T1R memory cell 200 in a stage of fabrication with a top spacer 246, a top S/D layer 242, and an interlayer dielectric 252 deposited over the Resistive memory device 204 and the FET 206. The 1T1R memory cell 200 is etched down so that the sidewall spacer 260 is no longer present, and the resistive memory device 204 and the FET 206 are further etched so that the fin 202 is exposed and able to contact the top S/D layer 242. The top spacer 246 is added to insulate the resistive memory device 204 and the FET 206 from leaking charge into the interlayer dielectric 252. The top S/D layer 242 can be formed, for example, by epitaxy with in-situ doping or any other suitable techniques.

Figure 12:
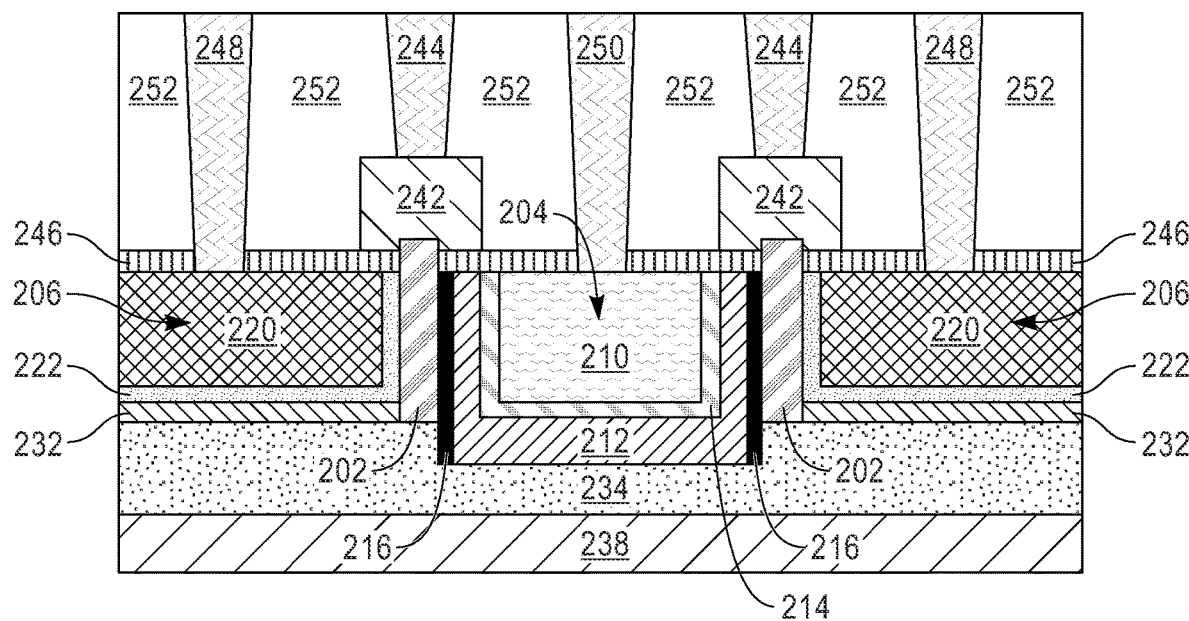

FIG. 12 depicts the 1T1R memory cell 200 in a stage of fabrication with bit line 244, word line 248, and source line 250 contacts deposited through the interlayer dielectric 252. The bit line 244 contacts electrically connect the top S/D layer 242 to the rest of the circuitry (not pictured) above the 1T1R memory cell 200. The word line 248 contacts electrically connect the gate conductor of FET 206 to the rest of the circuitry (not pictured) above the 1T1R memory cell 200. The source line 250 contacts connect the resistive memory device 204 to the rest of the circuitry (not pictured) above the 1T1R memory cell 200. Operation of the 1T1R memory cell 200, therefore includes a combination of voltages applied to the bit line 244, source line 250, and the word line 248 in order to set, reset, or read a current or voltage flowing through the resistive memory device 204. The vertical orientation of the fin 202, and the attendant proximity of the FET 206 and the resistive memory device 204 enable closer fabrication of the resistive memory device 204 and the FET 206. The benefits of condensed device proximity are well known as beneficial in the fabrication of memory cell devices. Furthermore, the gate dielectric 222 and the resistive element 214 are formed in separate process steps and thus can be independently tuned to meet the different requirements of gate dielectric and resistive element. Similarly, the top electrode 210 can the gate conductor 220 (including gate workfunction metal) are formed in separate process steps and thus can be independently tuned to meet the different requirements of the FET and resistive memory, for example, setting the FET with a proper threshold voltage and choosing the right material as the electrodes to create oxygen vacancy in the resistive element 214 for the resistive memory. All contacts can be formed by using a mask, patterning, and etching to form a contact trench or via, filling the contact trench/via with a conductive material or materials, and followed by planarization such as chemical mechanical polish. Each contact can be made of tungsten (W), aluminum (Al), copper (Cu), cobalt (Co), nickel (Ni), titanium (Ti), ruthenium (Ru), molybdenum (Mo), or any other suitable conductive material. The metal contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of the metal contact fill material with the top source drain material, and/or anode/cathode material. In various embodiments, the barrier layer can be deposited in the trench(es) by ALD, CVD, MOCVD, PECVD, or combinations thereof. In various embodiments, the metal fill can be formed by ALD, CVD, and/or PVD to form the electrical contacts.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory cell, comprising:
    a vertically-oriented fin;
    a resistive memory device located on a first lateral side of the fin below a top of the fin, wherein the resistive memory device comprises a bottom electrode, a top electrode, and a resistive element between the bottom electrode and the top electrode; and
    a vertical field-effect transistor (FET) comprising:
        a metal gate; and
        a gate dielectric contacting a second lateral side of the fin opposite the first lateral side.

2. The memory cell of claim 1, wherein the gate dielectric comprises a gate material, and wherein the gate material is different than the resistive element.

3. The memory cell of claim 1, comprising a top source/drain (S/D) at a top of the fin and a bottom source/drain (S/D) at a bottom of the fin, wherein the bottom source/drain is electrically connected to the bottom electrode.

4. The memory cell of claim 3, comprising a bottom spacer located between the gate dielectric and the bottom S/D.

5. The memory cell of claim 1, comprising a vertical spacer located between the fin and the bottom electrode.

6. The memory cell of claim 5, wherein the vertical spacer and the bottom electrode extend vertically down beyond a bottom of the fin.

7. The memory cell of claim 1, comprising a top spacer located above the vertical FET and the resistive memory device.

8. The memory cell of claim 1, wherein a material of the resistive element differs from a material of the gate dielectric only in an atomic concentration.

9. A method of fabricating a memory cell, comprising:
    forming a channel layer on a doped bottom source/drain (S/D) layer;
    etching a portion of the undoped channel layer to form a fin;
    forming a resistive memory device on a first lateral side of the fin;
    forming a gate dielectric contacting a second lateral side of the fin; and
    forming a metal gate contacting the gate dielectric.

10. The method of claim 9, wherein forming the resistive memory device comprises forming a bottom electrode, a top electrode, and a resistive element between the bottom electrode and the top electrode.

11. The method of claim 10, comprising forming a vertical spacer between the bottom electrode and the first lateral side of the fin.

12. The method of claim 9, wherein etching a portion of the channel layer comprises etching vertically into the doped bottom S/D layer.

13. The method of claim 9, comprising forming a bottom spacer located between the gate dielectric and the doped bottom S/D layer.

14. The method of claim 9, comprising forming a top spacer on the metal gate, the gate dielectric, and the resistive memory device.

15. A memory cell, comprising:
    a fin oriented vertically between a top source/drain (S/D) layer and a bottom S/D layer;
    a resistive memory device located on a first lateral side of the fin below a top of the fin comprising a bottom electrode electrically contacting the bottom S/D layer;
    a field-effect transistor (FET) comprising a gate conductor and a gate dielectric contacting a second lateral side of the fin.

16. The memory cell of claim 15, comprising:
    a word line electrically connected to the gate conductor of the FET;
    a bit line electrically connected to the top S/D layer; and
    a source line electrically connected to a top electrode of the resistive memory device.

17. The memory cell of claim 15, comprising a bottom spacer located between the gate conductor and the bottom S/D.

18. The memory cell of claim 15, comprising a vertical spacer located between the fin and the bottom electrode.

19. The memory cell of claim 18, wherein the vertical spacer and the bottom electrode extend vertically down beyond a bottom of the fin.

20. The memory cell of claim 17, wherein the resistive memory device comprises a resistive element having a material that differs from a material of the gate dielectric only in an atomic concentration.

* * * * *